United States Patent [19]

Nies et al.

[11] Patent Number: 5,136,973
[45] Date of Patent: Aug. 11, 1992

[54] PROCESS AND DEVICE FOR ELECTROSTATICALLY SPRAYING A LIQUID COATING ONTO A SUBSTRATE AND FOR DRYING THE LIQUID COATING ON THE SUBSTRATE

[75] Inventors: Reinhard Nies, Frankfurt am Main; Hermann Idstein, Oestrich-Winkel; Reinhold Becker; Guenter Hultzsch, both of Wiesbaden, all of Fed. Rep. of Germany

[73] Assignee: Hoechst Aktiengesellschaft, Frankfurt am Main, Fed. Rep. of Germany

[21] Appl. No.: 533,365

[22] Filed: Jun. 5, 1990

[30] Foreign Application Priority Data

Jun. 7, 1989 [DE] Fed. Rep. of Germany ....... 3918559

[51] Int. Cl.5 .............................................. B05B 5/025
[52] U.S. Cl. .................... 118/633; 118/634; 118/632
[58] Field of Search ............... 118/621, 633, 632, 634, 118/69, 50, 62; 198/408, 380, 390.1; 414/755, 768

[56] References Cited

U.S. PATENT DOCUMENTS

| | | | |
|---|---|---|---|
| 3,052,340 | 9/1962 | Lyons | 198/803.01 |
| 3,594,149 | 7/1971 | Pickavance et al. | 198/721 |
| 3,795,301 | 3/1974 | Sugitani | 198/690.1 |
| 3,865,227 | 2/1975 | Kaak | 198/778 |
| 3,174,740 | 4/1975 | Hurd | 198/380 |
| 3,902,587 | 9/1975 | Checcucci | 198/718 |
| 3,983,989 | 10/1976 | Wahren | 198/778 |

FOREIGN PATENT DOCUMENTS

| | | |
|---|---|---|
| 0195041 | 12/1988 | European Pat. Off. . |
| 2310808 | 10/1976 | France . |
| WO86/01745 | 3/1986 | PCT Int'l Appl. . |
| 0839591 | 6/1981 | U.S.S.R. ............... 118/69 |

Primary Examiner—W. Gary Jones
Assistant Examiner—Brenda Lamb
Attorney, Agent, or Firm—Foley & Lardner

[57] ABSTRACT

A device for applying a double-sided coating to a substrate comprises three transport lines which are mutually connected by conveying stations in the form of belt-type conveyors. The substrate is placed onto a paper web, and the upper surface of the substrate is coated with the liquid to be applied in a spraying station in an electrostatic field; subsequently dried; turned through 180° in the horizontal direction by a first belt-type conveyor; and passed onto a punched conveyor belt which is endlessly guided about a suction roller. The substrate is turned upside down by the suction roller, through a jet of compressed air. The substrate is transported onto a second belt-type conveyor where it is horizontally turned through 180° and conveyed onto the third transport line, in which it is again passed through a cleaning station and a spraying station where the other surface of the substrate is coated with a liquid resist. The substrate is then conveyed on to an air cushion produced by a dynamic air pressure box and is moved through the air pressure box by pushers rotating on an endless magnetic belt where it is cooled on the air cushions and then deposited in a tray.

14 Claims, 8 Drawing Sheets

PROCESS AND DEVICE FOR ELECTROSTATICALLY SPRAYING A LIQUID COATING ONTO A SUBSTRATE AND FOR DRYING THE LIQUID COATING ON THE SUBSTRATE

BACKGROUND OF THE INVENTION

The present invention relates to a process for electrostatically spraying a liquid coating onto a substrate and for drying the liquid coating on the substrate which is conveyed in the horizontal direction during the application and drying of said liquid coating, and to a device for performing the process.

In general, circuit boards are produced by lamination of a dry film or by applying a wet coating of liquid resist. Wet coating with a resist can be performed by immersion, roller application, casting, screen printing and, in particular for coating thin laminates, by electrostatic spraying processes.

Electrostatic spraying processes basically comprise dividing a liquid resist into very fine droplets by means of a spray device, electrically charging the droplets by means of high voltage and then depositing them on a grounded workpiece or substrate. The droplets flow on the surface of the substrate and give a wet film which is subsequently dried.

European Patent No. 0,195,041 has disclosed an electrostatic spray process for the resist-coating of circuit boards where the substrate is moved substantially perpendicularly relative to the spray device, in an electrostatic field produced by a high voltage generator. The liquid resist is sprayed towards the substrate which is supported by a transport belt passing through an electrostatic field. One electrode of the electrostatic device is grounded whereas the spray device for the liquid resist is connected to the high voltage electrode of a current generator. The transport belt for the substrate is a paper web. The spray device is comprised of an air turbine, the spray bell especially designed for liquid resist application, and of means for supplying the resist liquid. The spray bell is, for example, charged with negative direct voltage in the range of 40 kV to 90 kV.

Compact systems or assemblies are employed for the coating of circuit boards with the chamber, through which the substrate is conveyed during the electrostatic spraying-on of the liquid resist, being clad with a plastics material. During the spraying process, the walls are charged, and the negatively charged droplets are repelled. Photoresist droplets deposited between or beside the circuit boards are removed from the chamber by the paper web serving as transport belt. The resist-coated paper web is dried and removed as waste material. Thus, the transport means through the chamber need not be cleaned and there is no wet waste material. The liquid resist is applied from a supply tank to the inner surface of the spray bell by means of a controllable metering pump. The width of the resist coating can be continuously controlled within the desired range of 250 mm to 650 mm, either by automatic vertical adjustment means for the spray bell or by appropriate auxiliary electrodes and can thus be adapted to the width of the substrate used. The spray chamber is followed by an evaporation zone having a length of 1m to 2m, and downstream of the evaporation zone there is provided the drying zone which may be divided into several individually controllable sections. Where required, a cooling zone is also provided.

Using this known process and device, a relatively long processing time results when both surfaces of a substrate are to be coated with liquid resist. It is of a disadvantage that the already coated surface of the substrate tends to be deformed or embossed, respectively, when the substrate is conveyed through the drying zone of the coating device for the second time; for in order to obtain a double-sided resist coating, it is necessary to remove the substrate provided with a single-sided resist coating from the coating device, turn it upside down and insert it again into the coating device at the feed side. When the substrate is passed through the device for the second time, there is the danger that the already dried, downward-pointing resist layer gets soft again due to the action of heat in the drying chamber, as a result whereof the above-mentioned deformations may occur. Continuous, double-sided coating of substrates for circuit boards or of structured circuit boards is not possible using this known device.

SUMMARY OF THE INVENTION

It was therefore the object of the instant invention to develop a process for the double-sided coating of substrates of varying sizes with a liquid, in particular with a liquid resist, in a continuously operated device, without the already dried applied coatings being damaged during the further coating process.

In accordance with a first aspect of the invention, the process includes the steps of conveying substrates in a first transport direction and spraying a liquid on a first side of each of the substrates and then initially drying said first side while the substrates are being conveyed in said first transport direction. The succeeding steps include turning the substrates until they are being conveyed in a second transport direction different from said first transport direction, and then turning the substrates through 180° in the vertical direction while they are being conveyed in the second transport direction. The substrates are then turned until they are being conveyed in a third transport direction parallel to the first transport direction. Further steps include spraying a liquid on a second side of each of the substrates and then drying said second side while the substrates are being conveyed in the third transport direction.

In accordance with another aspect of the invention, the steps of conveying the substrates through the first, second, and third transport directions comprise the steps of conveying the substrates through first, second, and third transport lines of the device, respectively. In addition, the steps of turning the substrates as they are conveyed from the first transport line to the second transport line and from the second transport line to the third transport line comprise the steps of conveying the substrates through first and second conveying sections, respectively.

A further object of the invention is to provide a device for electrostatically spraying a liquid coating on both sides of a substrate and for drying the liquid coating of the substrate.

In accordance with one aspect of the invention, a device for electrostatically coating a substrate comprises a first transport line having a first conveyor adapted to transport a substrate through a first cleaning station, through a first spraying station which is connected to a lead of a high voltage generator and which has a spraying appliance for electrostatically applying a liquid coating, through a first initial drying zone or section, and through a first drying chamber. The device further includes a second transport line having a turn station adapted to turn the substrate vertically through 180° so that the substrate is inverted, and a third transport line having a second conveyor adapted to transport a substrate through a second cleaning station and a second spraying station which is connected to a lead of a high voltage generator and which has a spraying appliance for electrostatically applying a liquid coating. The second conveyor is further adapted to transport the substrate through a second initial drying zone or section and a second drying chamber. First and second conveying stations connect the first transport line to the second transport line and the second transport line to the third transport line, respectively.

In accordance with another aspect of the invention, a portion of each of the first and second conveyors comprises a paper web wound on a supply roll, a first or initial deflection roller located beneath the first cleaning station, a second or subsequent deflection roller located below the first initial drying station or section in the same horizontal plane as the first deflection roller, a take-up roll adapted to receive the paper web, and a pair of transport rollers located between the second deflection roller and the take-up roll.

In accordance with yet another aspect of the invention, the first and second conveying stations include a first semi-circular belt-type conveyor and a second semi-circular belt-type conveyor having a smaller diameter than that of the first semi-circular conveyor, respectively.

In accordance with yet another aspect of the invention, the second transport further comprises a first cooling zone or section and a transport zone or section which are arranged in a common tunnel on opposite sides of the turning station. The turning station comprises a suction roller and a probe, located proximate the suction roller, which detects a leading edge of the substrate and triggers an air source to release a jet of compressed air which inverts the substrate. The cooling zone comprises a punched, endlessly rotating belt guided about the suction roller. The transport zone comprises an endlessly rotating conveyor belt running with a slight upward inclination from a point below the turning station up to the second conveying station.

In accordance with yet another aspect of the invention, the second drying chamber comprises an air pressure box having first and second upper surface sections, slot nozzles located beneath both surface sections, and first and second deflection rollers located above the respective surface sections. An endless magnetic belt is mounted on the deflection rollers and is spaced above the first and second surface sections. Pushers are magnetically adhered to an upper strand of the magnetic belt. A vertically shiftable catch means selectively releases the pushers so that they can rotate about the deflection rollers and can move along the first and second surface sections synchronously with the passage of respective substrates through the air pressure box, whereby the pushers transport the substrates through an air cushion formed by the slot nozzles.

In accordance with still another aspect of the invention, the first and second conveying stations comprise serpentine-type conveyors. The first and third transport lines are co-planar and are aligned in parallel with one another, and the second transport line is located below the first and third transport lines and extends at an oblique angle relative to the first and third transport lines.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

In accordance with this invention, the stated objects are achieved in that one surface of the substrate which is conveyed in the direction of transport A is sprayed with liquid and dried, that the original direction of transport A is changed into a direction of transport B, which runs counter to direction A, and where the substrate is turned through 180° in the vertical direction so that the other surface of the substrate points upwardly, the direction of transport B is changed into a direction of transport C extending parallel to the original direction of transport A of the substrate, that the other surface of the substrate is sprayed with liquid and dried and then the dried substrate, which now carries a double-sided coating, is deposited, and that all changes of the directions of transport and the turning-over of the substrate are performed in continuous operation cycles.

In a further embodiment of the process, the substrate is conveyed through three transport lines of a device, whereby the direction of transport is changed when the substrate is conveyed from the first transport line to the second transport line and from the second transport line to the third transport line, upon passage through a first conveying station and a second conveying station, respectively. In the third transport line the substrate is expediently passed through a drying chamber while being freely floated on an air cushion and pushed forward at one end. In the area of the second drying chamber, the leading end of the substrate, seen in the direction of transport C of the substrate, has an upward inclination of 1° to 2°, relative to the horizontal.

In one variant of the process, two transport lines of the device are on the same level and the third transport line is provided above said level, whereas in another process variant the substrate is conveyed along three transport lines, which are arranged such that the first and the third transport line are provided side by side on one horizontal level and the second transport line is provided below the first transport line, and the substrate is conveyed by serpentine conveyors from the first to the second transport line and from the second to the third transport line, respectively. In this last-mentioned process variant, the liquid coating first applied to the substrate is dried during the passage of the substrate through the first serpentine conveyor which connects the first and the second transport lines.

A device for the electrostatic spraying of a liquid coating onto a substrate and for drying the applied coating, comprising at least one spraying station connected to a lead of a high voltage generator, and conveyor belts for transporting the substrate through the individual stations and chambers of the device, has the characterizing features that the device is comprised of a first through a third transport line, which are mutually connected by conveying stations, that a cleaning station, a spraying station comprising a spraying appliance for applying the liquid coating, an initial drying zone and a drying chamber are sequentially arranged in the first transport line and in the third transport line, and that a turn station is provided in the second transport line, where the substrate is turned vertically through 180° so that the underside of the substrate is turned up.

Figure 1:
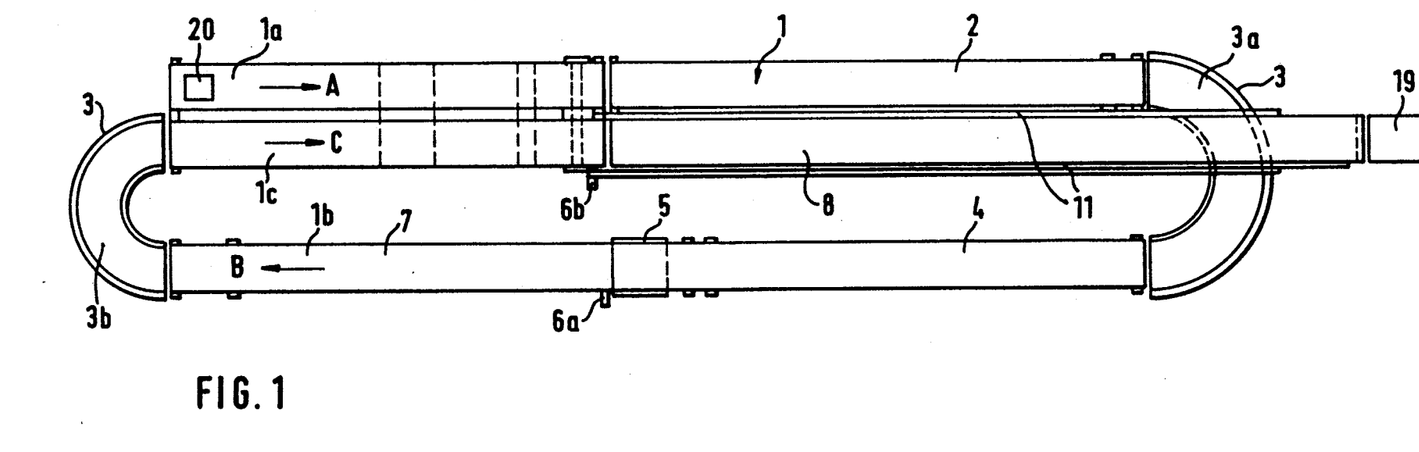
FIG. 1 shows a diagrammatic top view of one embodiment of the device according to this invention, for applying a double-sided liquid coating onto a substrate, FIGS. 2, 3 and 4 each show a sectional view of a first to third transport line of the device according to FIG. 1.

The plan view of FIG. 1 shows that a device 1 is comprised of a first, a second and a third transport line 1a, 1b, 1c which are arranged parallel to one another. The first and the second transport line are arranged in a common plane and connected by a conveying station 3 comprising a belt-type conveyor 3a having a semi-circular shape. In a similar manner, the second and the third transport line are connected by a conveying station 3 comprising a semi-circular belt-type conveyor 3b. The belt-type conveyor 3a has a greater radius than the belt-type conveyor 3b. The third transport line 1c extends somewhat above the two other transport lines, so that a substrate 20 present on the first belt-type conveyor 3a can be transported below a dynamic air pressure box 13 hereinafter simply referred to as pressure box, provided in the third transport line 1c.

Figure 3:
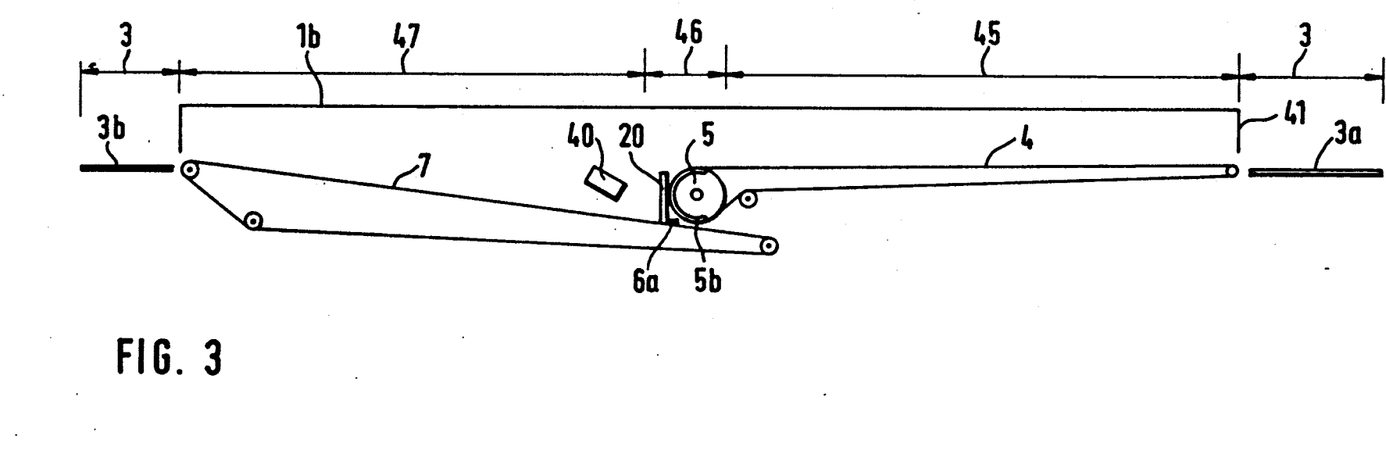
Figure 4:
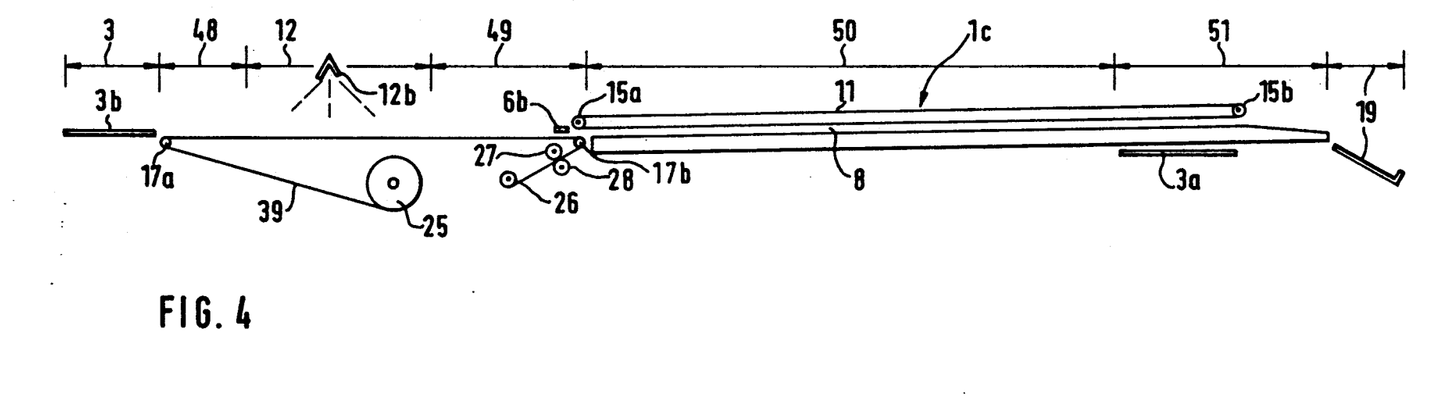

The substrates 20 for circuit boards, which are to be coated on both sides, are placed manually or automatically in any desired order of sequence and maintaining a mutual minimum distance of, for example, 15 mm, onto a paper web 30 (see FIG. 2) moving in the direction of transport A in a feed and cleaning station 42. The paper web 30 simultaneously is the transport belt for the substrates. From the paper web 30 the substrate 20 is first conveyed to a heat-resistant conveyor belt 2 and then onto the belt-type conveyor 3a. With reference to FIG. 3, the substrate 20 is passed by the latter onto a punched conveyor belt 4 which is guided about a suction roller 5. A probe 6a is installed close to the suction roller 5, and another probe 6b is installed at the transition point between the paper web 30 and the conveyor belt 2. As illustrated in FIG. 4, the suction roller 5 delivers the substrate to an inclined conveyor belt 7, and the substrate is conveyed in the direction of transport B running counter and parallel to the direction of transport A, to the belt-type conveyor 3b, by which it is passed on to another paper web 39 which also has the function of a non-endless transport belt, said paper web 39 extending in the direction of transport C which is in parallel alignment with the direction of transport A. The substrate is delivered by the web 39 to a drying chamber 50 where it is transported on an air cushion 8 to a deposition tray 19. The drying chamber 50 is provided with a magnetic belt 11 which will be described in greater detail below.

Figure 2:
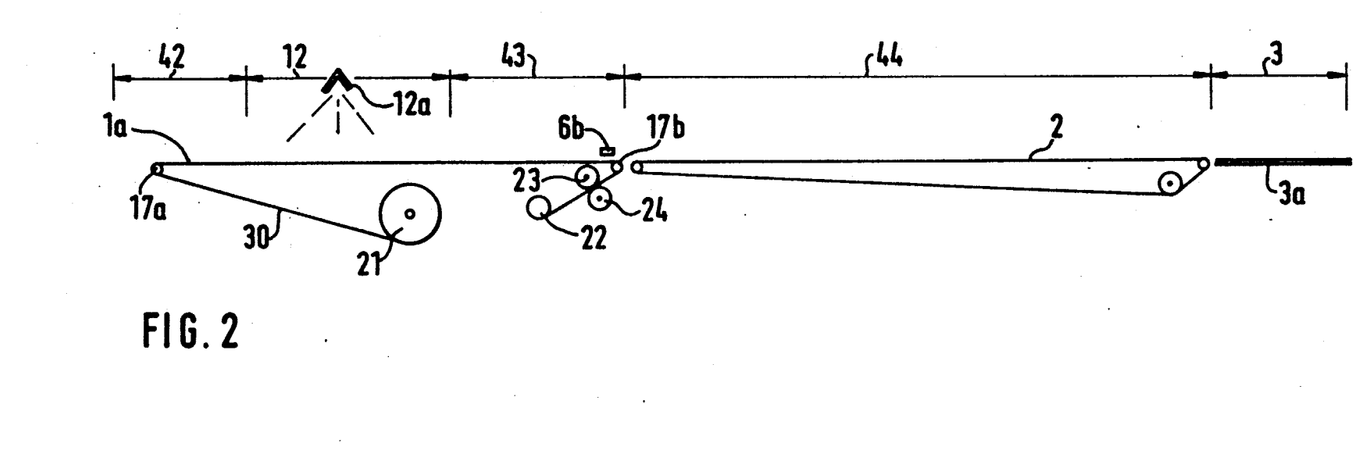

As can be seen from FIG. 2, the first transport line 1a is comprised of the feeding and cleaning station 42, a spraying station 12 connected to a lead of a high voltage generator and comprising a spray device 12a, for example a spray bell or spray head, a first initial drying zone 43, a first drying chamber 44 and the conveying station 3 comprising the belt-type conveyor 3a mentioned above for turning the substrate 20 through an angle of 180° in the horizontal plane. The paper web 30 is unwound from a supply roll 21 and guided horizontally through the first cleaning station 42, the first spraying zone 12 and the first initial drying station 43, about deflecting rollers 17a, 17b. After being guided about the second deflecting roller 17b, the paper web 30 is passed through the nip of a pair of transport rollers 23, 24 and finally wound onto a take-up roll 22. The substrates 20 are conveyed below the spray device 12a on the paper web 30 which cannot be re-used due to contamination by the sprayed-on liquid. When the paper web is completely unwound from the roll 21 and wound onto roll 22, a new roll of paper is inserted. In the first initial drying zone 43, the substrate surface sprayed with liquid is initially dried and then passed over onto the heat-resistant conveyor belt 2 and completely dried in the drying chamber 44.

The combined feed and cleaning station 42 is, for example, equipped with brushes and/or compressed-air blow nozzles to which ionized air is supplied for the removal of dust particles adhering to the substrate due to electrostatic effects.

After the first turn in the horizontal plane by means of the belt-type conveyor 3a, the substrate is delivered to the second transport line 1b shown in FIG. 3. It comprises a first cooling zone 45, the turn station 46, the transport zone 47 and the conveying station 3 for horizontally turning the substrates 20 once more. The first cooling zone 45, the vertical turn station 46 and the transport zone 47 are accommodated in a common tunnel 41, to which pure, cooled air is supplied. The cooling zone 45 includes a punched, endlessly rotating conveyor belt 4 which is guided about the suction roller 5 being part of the turn station 46. The suction roller may have the shape of a cylinder or of a polygon whose individual partial surfaces have predetermined segment lengths. The suction roller 5 has a punched surface, and reduced pressure is present in its internal space, so that each substrate 20 being guided about the surface of the suction roller 5 on the punched conveyor belt 4 is sucked on by the vacuum prevailing in the contact area between the conveyor belt and the suction roller 5. The substrates are turned vertically by the suction roller 5, as is illustrated in FIG. 3 showing a substrate 20 in its vertical position. The leading edge of the vertically aligned substrate 20 is detected by the probe 6a which triggers a jet of compressed air, which is blown either by a conventional air source through the suction roller 5 or through an air nozzle 40 installed a small distance away above the suction roller 5. The substrate guided about the suction roller 5 is tilted over or turned by this jet of compressed air, and as a result the substrate 20 is deposited on a conveyor belt 7 in the transport zone 47, with the formerly downward-pointing surface of the substrate 20 being directed upwardly and the other, already coated and dried surface being directed downwardly, i.e., facing the conveyor belt. The conveyor belt 7 has a slight upward inclination and circulates endlessly from below the turn station 46 to the second belt-type conveyor 3b.

Another spraying step, during which a coating is applied to the still uncoated surface of the substrate, takes place in the third transport line 1c shown in FIG. 4. The third transport line 1c comprises a second cleaning station 48, another spraying station 12, a second initial drying zone 49, a second drying chamber 50, a second cooling zone 51 and the deposition tray 19 for the substrates provided with a double-sided coating. The substrate 20 is conveyed along the third transport line 1c on a paper web 39 serving as transport belt and running through the cleaning station 48, the spray station 12 and the initial drying zone 49. The paper web is unwound from a supply roll 25 and guided about a deflection roller 17a. It runs horizontally through the individual stations mentioned above and is then deflected by another deflection roller 17b, is passed between a pair of transport rollers 27, 28 and wound onto a wind-up roll 26.

The two paper webs 30 and 39 in the transport lines 1a and 1c may also be replaced by a single, sufficiently wide paper web. The second cleaning station 48 and the first cleaning station 42 are of identical design. It is possible to install the cleaning and spraying stations provided in transport lines 1a and 1c for the two surfaces of the substrates in one common casing. Likewise, the drying chambers 44 and 50 for the two passes of each substrate can have one common casing.

To make sure that the already coated underside of the substrate is not damaged in the second drying chamber 50, the substrate is transported on the air cushion 8 produced in a pressure box 13. An endlessly rotating magnetic belt 11 is provided above the pressure box 13.

Figure 5:
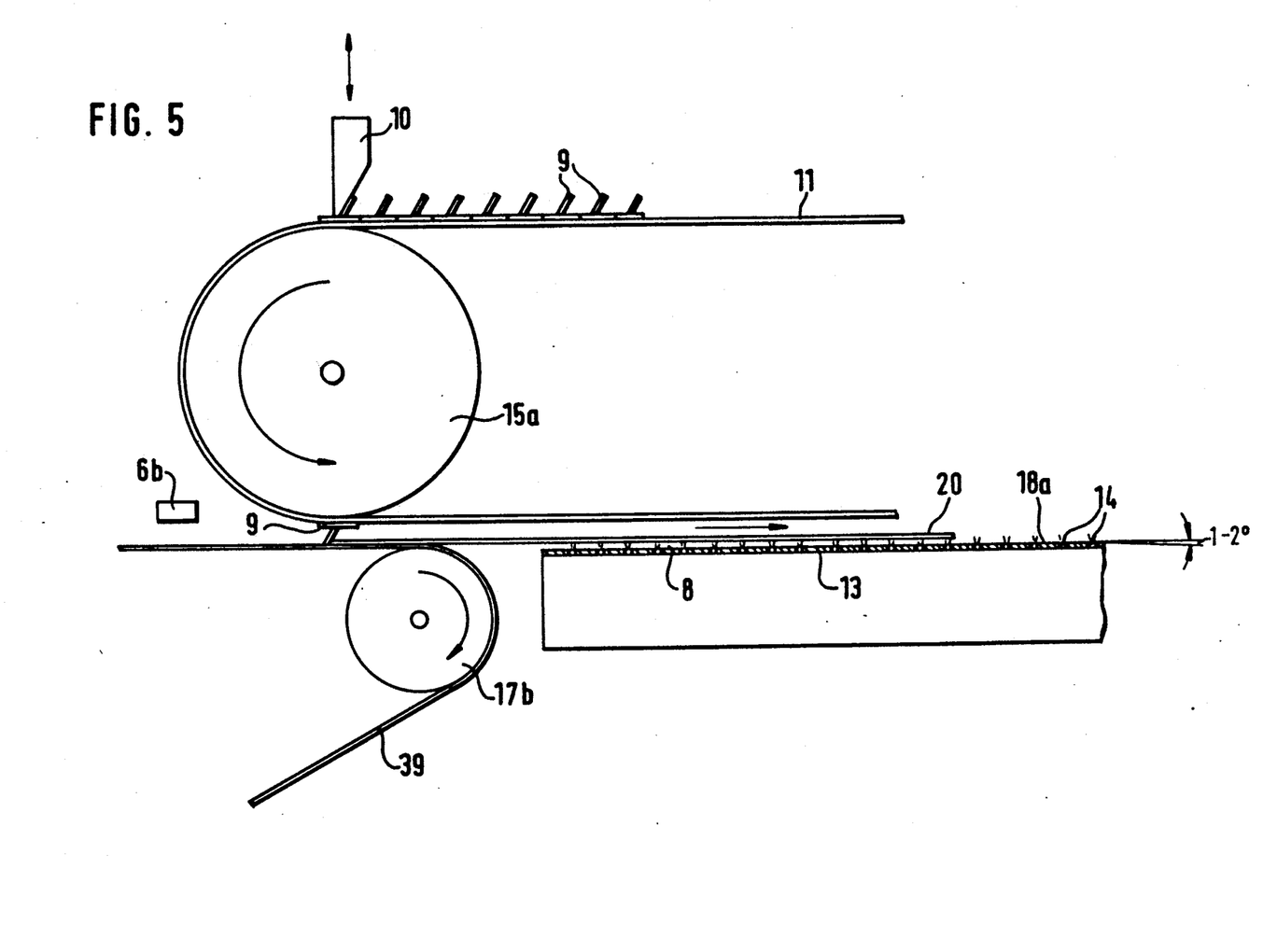
FIG. 5 shows an enlarged partial sectional view of a drying chamber in the third transport line of the device according to FIG. 1.
Figures 6, 7:
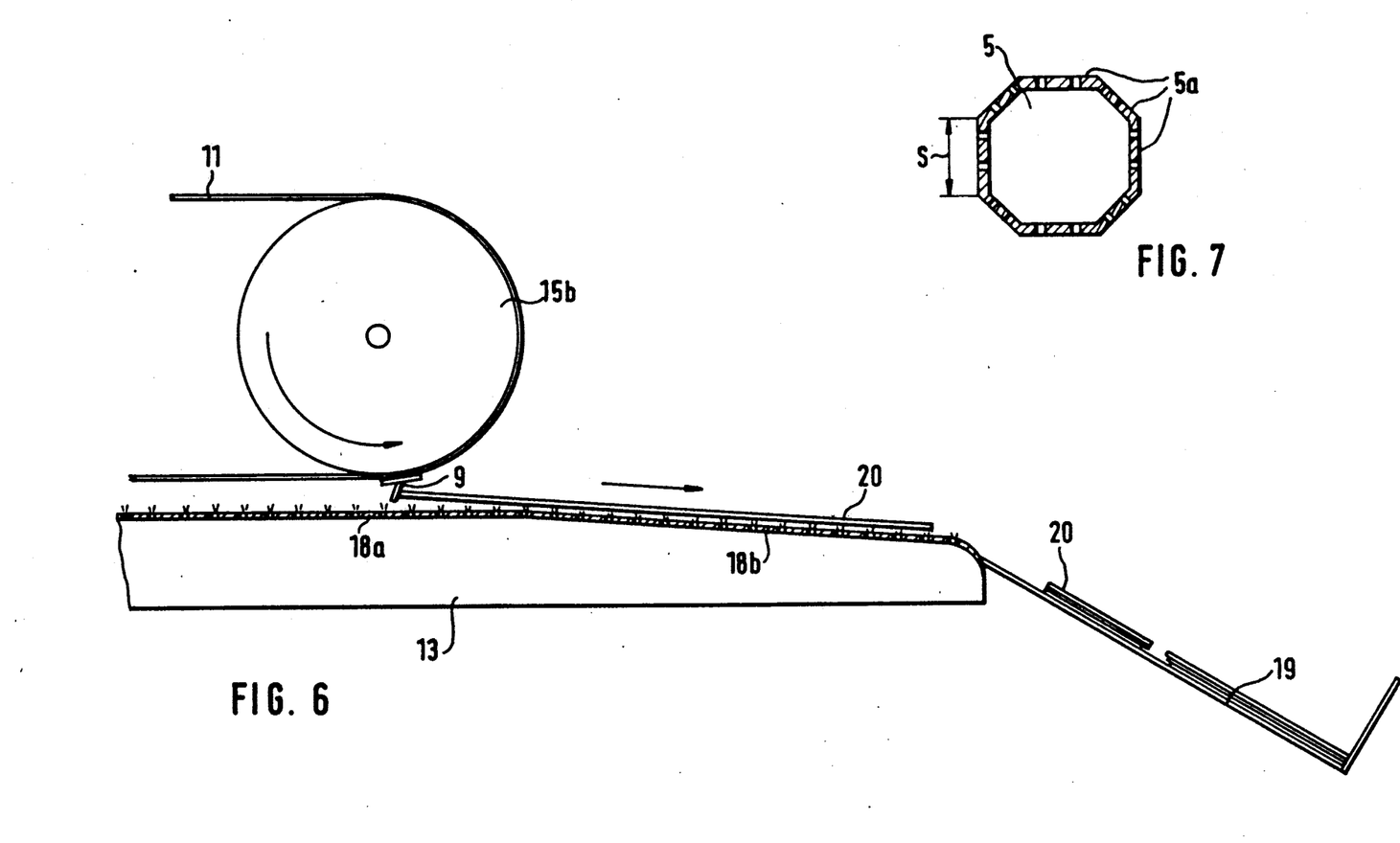
FIG. 6 shows an enlarged view of another section of the drying chamber and of a deposition tray for the substrates in the third transport line of the device according to FIG. 1.
FIG. 7 shows a cross-sectional view of a suction roller of a turn station of the device according to FIG. 1.

FIGS. 5 and 6 show enlarged, more detailed views of the drying chamber 50. The pressure box 13 comprises an essentially horizontal upper surface 18a and an oblique upper surface 18b, which both are provided with slot nozzles 14. The magnetic belt 11 is an endless belt which revolves about the deflection rollers 15a and 15b and is installed above the pressure box 13 at a distance from the latter. Magnetic pushers 9 adhere to the upper strand of the magnetic belt 11 close to the deflection roller 15a. These magnetic pushers are released by a vertically shiftable catch 10, so that they rotate on the magnetic belt 11 about the deflection roller 15a, synchronously with the cycles of the substrate 20 delivered from the paper web 39 to the air cushion 8 above the pressure box 13. The magnetic belt 11 is a commercially available belt made of so-called magnetic rubber which may, for example, comprise ferrite powder admixed into a synthetic rubber. The shape of the pushers 9 is similar to a "T" turned upside down, with the central bar being slightly inclined relative to the vertical line. During the transport of the substrates 20 through the drying chamber 50, the individual pushers 9 adhere to the lower strand of the magnetic belt 11. The advance movement of the substrates 20 on the air cushion 8 is effected by the pushers 9 rotating together with the magnetic belt 11 and being in contact with the rear edges of the substrates 20. The essentially horizontal upper surface 18a of the pressure box 13 has an upward inclination in the direction of transport of 1° to 2° relative to the horizontal, so that the rear edges of the substrates are always in contact with the pushers 9 during transport. The supporting air also helps to observe safety specifications concerning solvent concentrations in the drying chamber 50, i.e., the quantity of air required to maintain the air cushion makes sure that the lower explosion threshold value of the solvent/air mixture is not reached.

The rear section of the drying chamber 50 is constituted by the second cooling zone 51 which also comprises the inclined upper surface 18b of the pressure box 13 leading downward towards the deposition tray 19 for the substrates 20.

The probe 6b positioned close to the deflection roller 15a detects the leading edge of a substrate 20 conveyed on the paper belt 39 and triggers the catch 10, whereupon a pusher 9 is released and rotates together with the magnetic belt 11 in a way such that the pusher 9 comes to rest directly adjacent to the rear edge of the substrate 20 which meanwhile has been transferred to the air cushion, and thus the advance movement of the substrate is effected by the pusher, in the direction indicated by the arrow.

FIG. 7 shows a cross-sectional view of a suction roller 5 having a polygonal surface 5a composed of a number of segments of segment length s. The segment length s expediently corresponds to half the shortest substrate length to ensure that a substrate 20 conveyed about the suction roller 5 in the turn station adheres sufficiently well to the surface of the polygon. As pointed out above, the circumferential surface of the suction roller 5 may also be of cylindrical shape, the radius of the cylinder then being greater than/equal to the greatest substrate length. In this case, the interior of the suction roller 5 is expediently designed such that the required reduced pressure is not created over the total volume of the suction roller, but only in a section 5b extending as a sickle-shaped, sealed evacuation segment box over half the inner circumference of the suction roller 5 (see FIG. 3).

Figure 8:
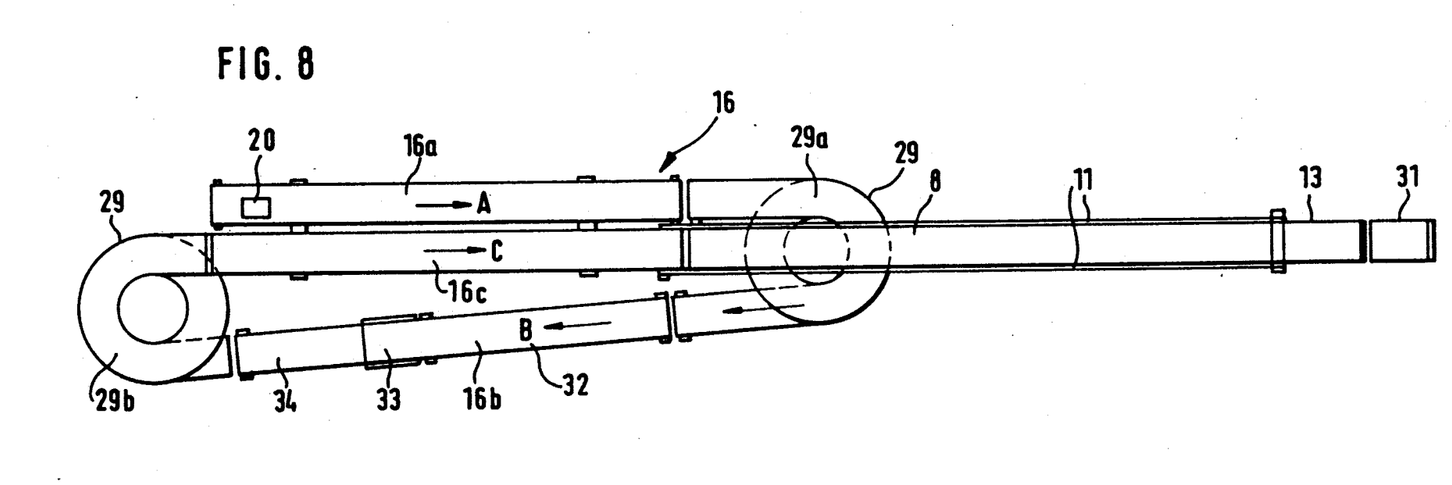
FIG. 8 shows a diagrammatic plan view of another embodiment of the device according to this invention for the double-sided coating of a substrate with a liquid.
Figure 9:
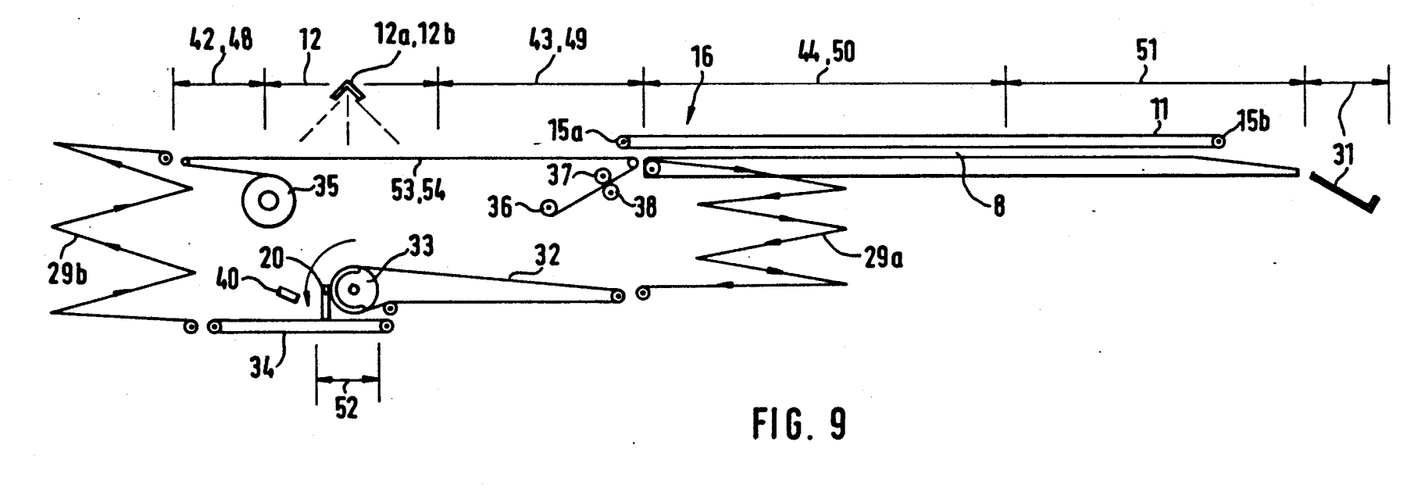
FIG. 9 shows a longitudinal sectional view of the device according to FIG. 8.

FIGS. 8 and 9 show another embodiment of a device 16 according to this invention. The mode of operation of this device 16 largely corresponds to the mode of operation of the device 1. The device 16 comprises three transport lines 16a, 16b, 16c, and conveying stations 29 connect the first and the second transport lines and the second and the third transport lines. The conveying stations 29 are serpentine-type conveyors 29a and 29b. The first and the third transport lines 16a, 16c are arranged parallel and side-by-side in one plane, whereas the second transport line 16b extends below this plane and obliquely relative to the direction of the first and third transport lines. In FIGS. 8 and 9 those component parts which are identical to the embodiment shown in FIGS. 1 to 4 bear the same reference numerals as in FIGS. 1 to 4 and are not described once more.

The first transport line 16a comprises the feed and cleaning station 42, the spraying station 12 with a spray device 12a and the initial drying zone 43. A paper web 53 is unwound from a supply roll 35 and guided horizontally through the cleaning station 42, the spray station 12 and the initial drying zone 43, about two deflection rollers. Thereafter, the paper web 53 is passed through the nip between two transport rollers 37, 38 and is wound onto a take-up roll 36. The paper web 53 delivers the substrate inserted into the feed and cleaning station 42 to the serpentine-type conveyor 29a, by which the substrate coated on its upper surface and initially dried is conveyed down onto the second transport line 16b and further dried. Thereby the conveying direction A of the substrate is turned through approximately 180°, into the conveying direction B. The second transport line 16b comprises a punched, obliquely extending conveyor belt 32 which rotates endlessly about a suction roller 33. This suction roller 33 is part of a turn station 52 designed and operating in the same way as turn station 46 shown in FIG. 1. The substrate, which has been tilted over through 180° or turned upside down, respectively, by a jet of compressed air blown through the air nozzle 40 or through the suction roller 33, is conveyed to the second serpentine-type conveyor 29b by an endlessly rotating horizontal conveyor belt 34. The serpentine-type conveyor 29b raises the substrate to the level of the third transport line 16c and simultaneously turns it through about 180°, from the conveying direction B to conveying direction C which runs parallel to conveying direction A. The third transport line 16c comprises the second cleaning station 48, the spraying station 12 with a spray device 12b, the second initial drying zone 49, the second drying chamber 50, a cooling zone 51 and a deposition tray 31 for the substrates coated on both surfaces. The second drying chamber 50 and the second cooling zone 51 have been described in detail above with reference to the embodiment shown in FIGS. 1 to 4 and therefore are not described once more.

Figure 10:
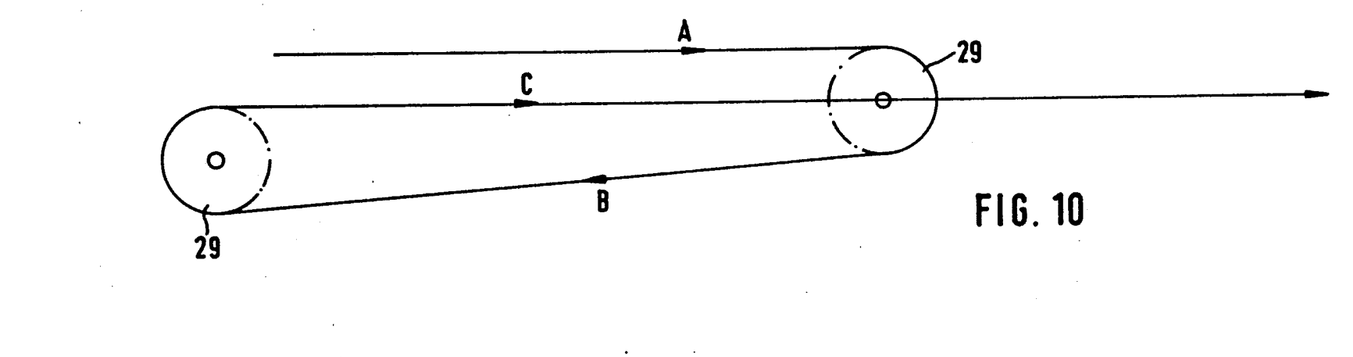
FIG. 10 shows a diagram of the path of the material through the device according to FIG. 8.

FIG. 10 diagrammatically shows the path of the substrates through the device 16, which is of a more compact design than the device 1.

The advantage offered by the present invention is that first one surface of a substrate is coated with a liquid coating, in particular a liquid resist coating, and dried, thereafter the substrate is conveyed back to the feed-in end of the coating device and thereby turned upside down by special conveying means, and finally the substrate is passed again through the spraying station and drying chamber on an air cushion, on a path laterally adjoining the first transport line, it being thus made sure that the downward pointing, previously coated surface of the substrate is not damaged or deformed during the passage through a further drying chamber. Due to the continuous operation of the process, considerable saving of time is accomplished compared with a conventional process where the substrates have to be turned manually after a single-sided coating has been applied and are inserted once more into the coating device for the coating of the uncoated surface.

What is claimed is:

1. An apparatus for electrostatically coating a substrate, said apparatus comprising:
    (A) a first transport line having a first conveyor adapted to transport a substrate through a first cleaning station, a first spraying station which is connected to a lead of a high voltage generator and which has a spraying appliance for electrostatically applying a liquid coating, a first drying section, and a first drying chamber, wherein said first cleaning station, said first spraying station, said first drying section and said first drying chamber are arranged in succession;
    (B) a second transport line having a turning station including suction air and compressed-air devices for turning said substrate vertically through 180° so that the substrate is inverted;
    (C) a third transport line having a second conveyor adapted to transport a substrate through a second cleaning station, a second spraying station which is connected to a lead of a high voltage generator and which has a spraying appliance for electrostatically applying a liquid coating, a second drying section, and a second drying chamber, wherein said second spraying station, said second drying section and said second drying chamber are arranged in succession and a respective two of said three transport lines are arranged parallel to one another in a common plane, and the remaining transport line is extended vertically away from said respective transport lines; and
    (D) first and second conveying stations connecting the first transport line to the second transport line and the second transport line to the third transport line, respectively.

2. The device of claim 1, wherein a portion of said first conveyor comprises a paper web wound on a supply roll, a first deflection roller located beneath said first cleaning station, a second deflection roller located below said first drying section in horizontal plane with said first deflection roller, a take-up roll adapted to receive said paper web, and a pair of transport rollers located between said second deflection roller and said take-up roll.

3. The device of claim 1, wherein said first and second conveying stations comprise a first semi-circular belt-type conveyor and a second semi-circular belt-type conveyor having a smaller diameter than that of said first semi-circular conveyor, respectively.

4. The device of claim 1, wherein said second transport line further comprises a first cooling section and a transport section which are arranged in a common tunnel on opposite sides of said turning station; and wherein said suction air device includes a suction roller, said turning station further comprises a probe which is located proximate said suction roller and adapted to detect a leading edge of said substrate and to trigger an air source of said compressed-air device to release a jet of compressed air which inverts said substrate; said cooling section comprising a punched, endlessly rotating belt guide about said suction roller, and said transport section comprising an endlessly rotating conveyor belt running with a slight upward inclination from a point below the turning station up to said second conveying station.

5. The device of claim 4, wherein said air source is structured and arranged to blow compressed air through one of said suction roller and an air nozzle arranged at an oblique angle above said suction roller.

6. The device of claim 4, wherein the suction roller has a polygonal surface having a segment length corresponding to one-half of a shortest substrate length.

7. The device of claim 4, wherein the radius of said suction roller is at least as long as a greatest substrate length.

8. The device of claim 1, wherein a portion of said second conveyor comprises a paper web wound on a second conveyor supply roll, an initial deflection roller located beneath said second cleaning station, a subsequent deflection roller located below said second drying section in a common horizontal plane with said initial deflection roller, a second conveyor take-up roll adapted to receive said paper web, and a pair of second conveyor transport rollers located between said subsequent deflection roller and said second conveyor take-up roll.

9. The device of claim 8, wherein said second drying chamber comprises an air pressure box having first and second upper surface sections, slot nozzles located beneath both surface sections, said initial and subsequent deflection rollers located above the first and second surface sections, respectively, and an endless magnetic belt mounted on said initial and subsequent deflection rollers and spaced above said first and second surface sections, said air pressure box further comprising pushers magnetically adhered to an upper strand of said magnetic belt and a vertically shiftable catch means for selectively releasing said pushers so that they can rotate about said initial and subsequent deflection rollers and can move along said first and second surface sections synchronously with the passage of respective substrates through said air pressure box, whereby said pushers transport said substrates through an air cushion formed by said slot nozzles.

10. The device of claim 9, wherein said first surface section is upwardly inclined at an angle of from 1° to 2° towards said second surface section.

11. The device of claim 9, further comprising a deposition tray located adjacent said second surface section, wherein said second surface section is inclined downwardly toward said deposition tray.

12. The device of claim 1, wherein said first and second conveying stations comprise serpentine-type conveyors, wherein said first and third transport lines are co-planar and are aligned in parallel with one another, and wherein said second transport line is located below said first and third transport lines and extends at an oblique angle relative to said first and third transport lines.

13. The device of claim 12, wherein said serpentine-type conveyors are adapted to turn said substrates through an angle of about 180° with respect to their respective original directions of transport.

14. An apparatus for electrostatically coating substrates, said apparatus comprising:
  (A) a first transport line having a first spraying station which is connected to a lead of a high voltage generator and which has a spraying appliance for electrostatically applying a liquid coating, a first drying section, and a first drying chamber, wherein said first spraying station, said first drying section and said first drying chamber are arranged in succession;
  (B) a second transport line extending in a direction different from that of said first transport line and having a means for turning said substrate vertically through 180° so that the substrate is inverted, said turning means including suction air and compressed-air devices;
  (C) a third transport line located in parallel with said first transport line and having a second spraying station which is connected to a lead of a high voltage generator and which has a spraying appliance for electrostatically applying a liquid coating, a second drying section, and a second drying chamber, wherein said second spraying station, said second drying section and said second drying chamber are arranged in succession, and a respective two of said three transport lines are arranged parallel to one another in a common plane, and the remaining transport line is extended vertically away from said respective two transport lines; and
  (D) means for continuously conveying said substrates through said first transport line, from said first transport line to said second transport line, through said second transport line, from said second transport line to said third transport line, and through said third transport line.

* * * * *